United States Patent [19]
Choudhury et al.

[11] Patent Number: 5,644,311
[45] Date of Patent: Jul. 1, 1997

[54] PULSE WIDTH MODULATION PULSE SHAPER

[75] Inventors: Ashfaq Choudhury; Humphrey Gordon, both of Calgary, Canada

[73] Assignee: NovAtel Communications, Ltd., Calgary, Canada

[21] Appl. No.: 499,292

[22] Filed: Jul. 7, 1995

[51] Int. Cl.$^6$ ................................................... H03M 5/08
[52] U.S. Cl. ........................................... 341/152; 375/238
[58] Field of Search .................................. 341/152, 147, 341/117, 126, 141; 375/22

[56] References Cited

U.S. PATENT DOCUMENTS

| | | |
|---|---|---|
| 5,021,788 | 6/1991 | Ueki et al. .................... 341/152 |
| 5,198,818 | 3/1993 | Samueli et al. . |
| 5,237,324 | 8/1993 | Linz et al. . |

FOREIGN PATENT DOCUMENTS

WO9211699  9/1992  WIPO .

*Primary Examiner*—Brian K. Young
*Attorney, Agent, or Firm*—Cesari and McKenna, LLP

[57] ABSTRACT

A system uses a charge storage unit to produce shaped pulses in response to an incoming digital signal. The system detects transitions or patterns in the digital signal and produces a charging waveform that controls the charge maintained in the charge storage unit, and thus, the instantaneous value of an output voltage produced by the unit. The charging waveform is, in turn, controlled by transition characteristics or counts that are stored, respectively, in transition memories. In the case of a binary transmission the memories contain rising and falling characteristics. These memories are addressed by addresses generated in response to the detection of a pattern, or as appropriate, a transition in the incoming digital signal. The charging waveform may be a series of pulses with varying widths, a signal that has a variable duty cycle, or a varying pulse count. The charging waveform controls the charging of capacitors in the charge storage unit, which consists essentially of cascaded low pass filters. In a preferred embodiment, a buffer amplifier is placed between the low pass filters, to isolate them and allow the system to control more easily the amplitudes of the shaped pulses.

16 Claims, 3 Drawing Sheets ns**
PULSE WIDTH MODULATION PULSE SHAPER

FIELD OF THE INVENTION

This invention relates generally to systems for digital-to-analog conversion and, more particularly, to systems that invert individual digital bits to analog signals with desired pulse shapes.

BACKGROUND OF THE INVENTION

In systems that transmit digital information in the form of analog signals, digital-to-analog conversion is required. Digital-to-analog converters (DACs) are typically relatively complex because they are capable of generating any arbitrary analog waveform from its corresponding digital representation.

Digital communication systems, such as digital cordless telephone systems, transmit digital data in the form of analog signals. In such systems the digital-to-analog (D/A) conversion process involves generating a small predetermined set of analog waveforms in response to the digital data that are to be transmitted. For example, a binary transmission scheme requires only two analog waveforms that correspond, respectively, to the rising and falling edges of the binary bit stream. In such a system, the D/A conversion process can be simplified to one that generates only the two required analog waveforms.

A binary digital signal has at times representing bits either a maximum value or a minimum value, denoting, respectively, a 1 or a 0. The signal preferably includes sharp, ideally instantaneous, transitions between these two values. This ensures that the signal will have attained its minimum or maximum value, as appropriate, at or near the start of the associated bit time, or bit position. Otherwise, the signal may be in between the maximum and minimum values at the bit times, which can lead to an incorrect assignment of bit values to the signal.

Ideally, the analog signals to which the binary signals are converted have the same sharp transitions. However, other constraints, such as constraints on the use of RF frequency, require that the transitions be smoothed.

In particular, wireless communications systems generally require that RF transmissions be contained within a specified frequency range, or channel. If the analog signal used to modulate the RF transmission includes the sharp transitions, it causes the RF transmission to occupy a wider frequency range, or bandwidth, that may exceed the specified frequency range. Accordingly, to avoid transmission problems, the systems typically spread or smooth the signal transitions in the time domain to limit the occupied frequency bandwidth. If, however, the transitions are spread too much, a receiver may have trouble detecting them within the prescribed bit times particularly in the presence of noise, and thus, it may assign incorrect bit values to the received signal.

One solution is to transmit analog signals with Gaussian shaped pulses. These pulses have smooth transitions, and thus, result in relatively narrow occupied frequency bandwidth. Further, the slopes of the transitions are relatively steep and easy to detect.

The problem with using Gaussian shaped pulses is producing them. Known prior systems that produce such pulses are costly. One example is an analog Gaussian filter that shapes the binary pulse in the continuous time domain. The filter is expensive because of component requirements and manufacturing alignments. Alternatively, a conventional D/A converter can be used. The system typically oversamples the input binary stream and, using lookup tables or by computation, determines the appropriate analog value of the pulse at each bit time of the oversampling clock. It then generates a signal with these values using a conventional D/A converter.

SUMMARY OF THE INVENTION

The invention is a system that uses a "charge storage unit" to produce, in response to a binary bit stream, analog output pulses with desired shapes. The system detects transitions in the binary bit stream and drives the charge storage unit with a charging waveform, such as a sequence of square pulses with varying widths, or any other waveform that has a width or duty cycle that can be varied. In this way a given amount of charge is transferred to the charge storage unit over a predetermined time period. In response, the charge storage unit, which consists essentially of cascaded low pass filters, produces an increased, decreased or constant output voltage that corresponds to a section of the output pulse. The result is a pulse with a desired shape.

More specifically an edge detector detects a rising or falling edge in the binary bit stream. The edge detector controls an address generator that supplies a sequence of N addresses to a memory to extract therefrom N stored code words, or counts. The counts are supplied to a charging waveform generator that produces a waveform, such as a sequence of pulses with widths that correspond to the counts. For example, the generator produces for a count of 6 out of 8, a maximum-valued pulse with a width that corresponds to six clock cycles and a zero-valued "pulse" with a width that corresponds to two clock cycles. Alternatively, the generator produces for the series of eight clock cycle, six maximum-valued pulses in six of the eight clock cycles and a zero-valued signal for the remaining two clock cycles.

The pulses are applied to the charge storage unit, to control the charge on the capacitors in the low pass filters, and thus, determine the amplitude of the instantaneous output voltage produced by the charge storage unit.

To minimize the number of addresses the address generator must produce, the system includes two memories, one for rising edge characteristics and one for falling edge characteristics, and a multiplexer that is under the control of the edge detector. The addresses produced by the address generator are applied simultaneously to both of the memories, and each memory, respectively, supplies a count to the multiplexer. The multiplexer, under the control of the edge detector, selects between the counts supplied by the memories and passes the appropriate one to the charging waveform generator.

The characteristics of the rising and falling edges of the pulses can be readily altered by changing the contents of the memories. Further, the characteristics of these edges need not be identical, to compensate for variations in the system components. Also, the system can produce pulses of any shape, simply by altering the contents of the two memories.

BRIEF DESCRIPTION OF THE DRAWINGS

The above and further advantages of the invention may be better understood by referring to the following description in conjunction with the accompanying drawings, in which.

DETAILED DESCRIPTION OF AN ILLUSTRATIVE EMBODIMENT

Figure 1:
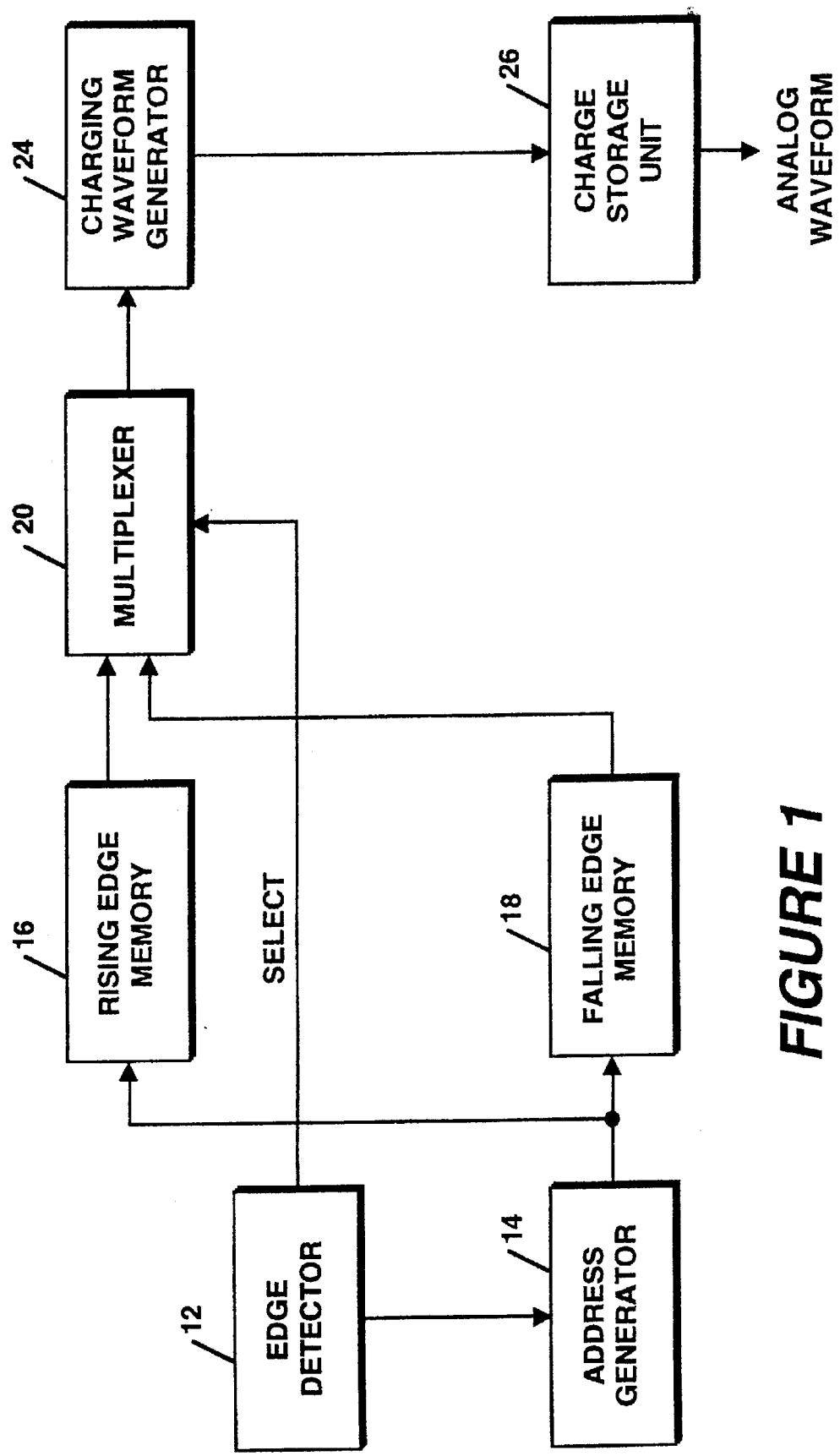
FIG. 1 is a functional block diagram of a pulse shaping system constructed in accordance with the invention.

In FIG. 1, a system 10 receives a binary bit stream and, based on transitions in the bit stream, produces a corresponding charging waveform. This waveform is applied to a "charge storage unit" that produces an analog signal, which includes pulses of a desired shape.

An edge detector 12 detects the rising and falling transitions in the binary bit stream and produces signals that control, respectively, the operations of an address generator 14 and a multiplexer 20.

The address generator 14 produces a sequence of N addresses per transition in the binary bit stream. The addresses correspond to locations in a rising edge memory 16 and a falling edge memory 18 that each contain code words, or counts, that are used to control essentially the varying duty cycle of the charging waveform produced by charging waveform generator 24. The charging waveform drives the charge storage unit 26, which produces for each transition detected by the edge detector one edge of a shaped pulse. The generator 22 and the charge storage unit 26 are discussed in more detail below with reference to FIG. 2.

The counts retrieved from the memories 16 and 18 are supplied to the generator 24 via the multiplexer 20. The multiplexer 20, under the control of the edge detector 12, passes to the generator 24 either the counts retrieved from the rising edge memory 16 or the counts retrieved from the falling edge memory 18. When the edge detector detects a rising, i.e., a 0 to 1, transition in the binary bit stream, the multiplexer passes the counts retrieved from memory 16, and conversely, when the edge detector 12 detects a falling, i.e., a 1 to 0, transition in the binary bit stream the multiplexer 20 passes the counts retrieved from the falling edge memory 18.

Figure 2:
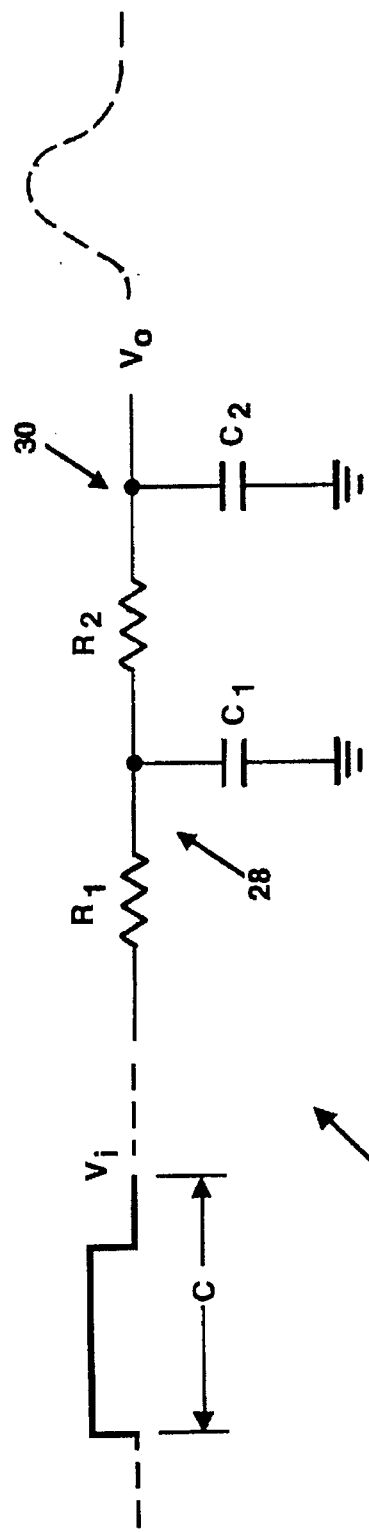
FIG. 2 is a circuit diagram of a "charge storage unit" included in the system of FIG. 1.

Referring now to FIG. 2 in conjunction with FIG. 1, the charge storage unit 26 consists of cascaded low pass filters 28 and 30. The charging waveform from charging wave form generator 24 controls the charges on capacitors C1 and C2, and thus, the amplitude of the output voltage, Vo, produced by the charge storage unit. In the absence of a charge transfer from the generator 34, the capacitors C1 and C2 discharge through the resistors.

The charging waveform generator 24 produces a signal with a varying duty cycle or, alternatively, a series of square pulses that cause the capacitors C1 and C2 to charge or discharge in a controlled manner. In the exemplary embodiment, the generator 24 produces a series of square pulses with varying widths.

For each rising or falling edge, the generator 24 produces N samples. Each sample is associated with C clock cycles of the generator, where C is a maximum count. In response to a count of, for example, 5 out of 8, the generator produces a maximum-valued pulse for five clock cycles and a zero-valued signal for three clock cycles. Alternatively, the generator produces five maximum valued pulses in 5 of the 8 clock cycles, and zero-valued signals for the three remaining clock cycles. The five maximum-valued pulses need not be produced in contiguous clock cycles. If they are, however, the result is the same as producing a single maximum-valued pulse that is five clock cycles wide.

The charging waveform results in the charging of capacitors C1 and C2 to a level that produces, for this sample period of eight clock cycles, an output voltage that corresponds to a portion of the rising edge of the shaped pulse, as depicted by the solid segment of the Gaussian pulse illustrated in FIG. 2.

To produce the falling edge, the generator 24 supplies to the charge storage unit 26 a series of square pulses with narrower, or alternatively, fewer, maximum-valued pulses. This controls the discharging of the capacitors. The result is a falling edge with a desired shape.

As discussed above, the address generator 14 produces a sequence of N addresses for each edge of the shaped pulse. The address generator is thus clocked at a rate that is N times faster than the clock rate of the incoming binary bit stream data. For example, if the clock rate is 80 kilohertz, the stream can have an edge at most every 12.5 microseconds. The address generator must, within the 12.5 microseconds following an edge, produce the N addresses. This corresponds to taking N samples of the incoming signal.

The charging waveform generator 24, in response to the receipt of a count from one of the memories, produces a square pulse that is S clock cycles wide, where S varies from 0 to C. This is analogous to producing a signal with a duty cycle of S/C. The generator must thus be clocked by a clock (not shown) that runs C times faster than the address generator's clock (not shown).

For every edge in the incoming binary signal, the system thus produces N samples, each with a resolution of C. The values of N and C are chosen to push the aliased spectrum created by the sampling operation far beyond the frequencies of interest, to avoid problems with the reproduction of the binary data at a receiver. In the exemplary embodiment, N is 20 and C is 8.

When the edge detector 12 detects a transition in the binary bit stream, for example, a rising edge, the edge detector supplies to the address generator 14 an edge signal that starts the address generator producing a predetermined sequence of 20 addresses. The address generator may, for example, include a counter (not shown) that is reset by the signal from the edge detector.

The address generator supplies the sequence of 20 addresses simultaneously to the rising edge memory 16 and the falling edge memory 18. In response to each address, the rising edge memory 16 and the falling edge memory 18, respectively, retrieve the code words contained in the addressed locations. The multiplexer 20, which receives a rising edge signal from the edge detector 12, passes to the charging waveform generator 24 the sequence of code words retrieved from the rising edge memory 16, and refrains from passing those retrieved from the falling edge memory 18.

The generator 24, in response to the counts, produces for each count a square pulse that is up to C clock cycles wide. For a sequence of counts of 1, 5, and 8, for example, the generator produces for a series of three 8 clock cycle periods: in the first a pulse of maximum value that is one clock cycle wide and a zero-valued signal for seven clock cycles; in the second, a maximum-valued pulse that is five clock cycles wide and a zero valued signal for three clock cycles; and in the third a maximum-valued pulse that is eight clock cycles wide.

The pulses are supplied to the charge storage unit 26. The capacitors C1 and C2 begin to charge as the first pulse is received and continue charging at rates that correspond to the number of maximum-valued pulses received per sample from the generator 24. The charge on the capacitors is at a maximum when the last pulse of the twentieth sample is received.

If a falling edge in the binary data stream is not then detected, the address generator 14 repeatedly produces the last two addresses of the 20-address sequence. If the address generator 14 is a counter, for example, it toggles between counts 19 and 20.

In response to the repeated addresses, the memory provides the last two of the sequence of twenty code words to the generator 24, and the generator 24 then reproduces the last two series of 8 pulses. These pulses are supplied to the charge storage unit 26, to maintain the maximum charge on the capacitors C1 and C2.

When a falling edge is detected by the edge detector 12, it resets the address generator 14 and directs the multiplexer 20 to pass to the generator 24 the code words retrieved from the falling edge memory 18. The generator 24, in response, produces a series of pulses that include progressively fewer and fewer, or narrower and narrower maximum-valued pulses. This allows the capacitors in the charge storage unit to discharge and produce the falling edge of the shaped pulse.

If a rising edge is not detected when the 20-address sequence is completed, the address generator 14 again continues to reproduce the last two addresses in the sequence, and in response the generator 24 continues to produce the last two 8-pulse series. This results in a predetermined minimum charge being maintained on the capacitors C1 and C2. If a minimum charge is not required, the system may disable the address counter until a next rising edge is detected.

The characteristics of the rising and falling edges of the shaped pulse are controlled by the contents of the memories 16 and 18. Accordingly, pulses of various shapes can be produced by altering the contents of the memories. Further, the rising and falling edges of the shaped pulse need not be identical, to compensate for variations in the system components that tend to distort the shape of the pulses.

A single memory may be used in place of the memory 16 and 18. If so, either the count of the address generator must be large enough to address 2N, or in the example 40, different addresses, or the system must include translation circuitry that translates the addresses, as appropriate, to correspond to locations that contain the rising edge code words or the falling edge code words.

Figure 3:
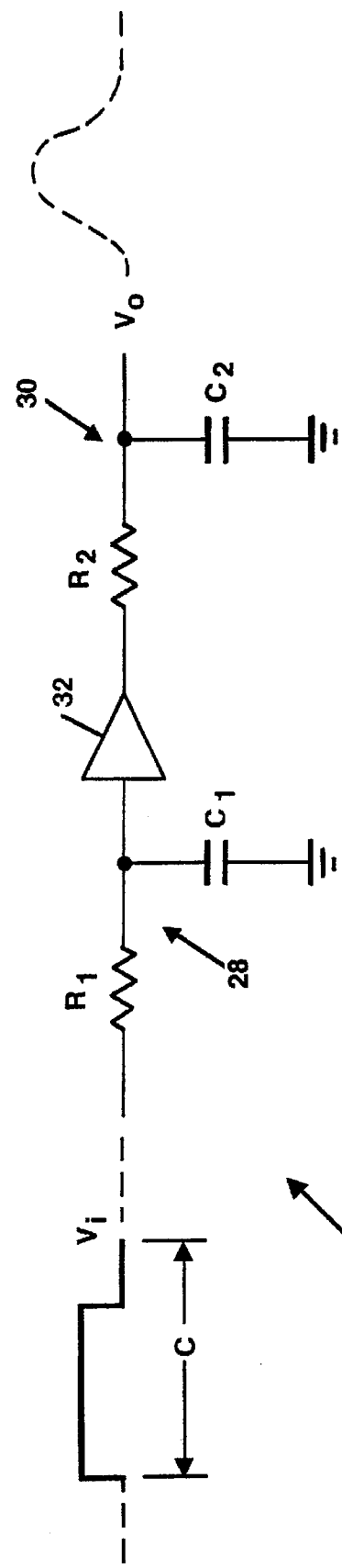
FIG. 3 is a functional block diagram of a preferred embodiment.

In a preferred embodiment, as depicted in FIG. 3, a buffer amplifier 32 is included in the charge storage unit 26. The amplifier isolates the two filters, and gives the system more control over the amplitude of the shaped pulse produced by the unit.

Figure 4:
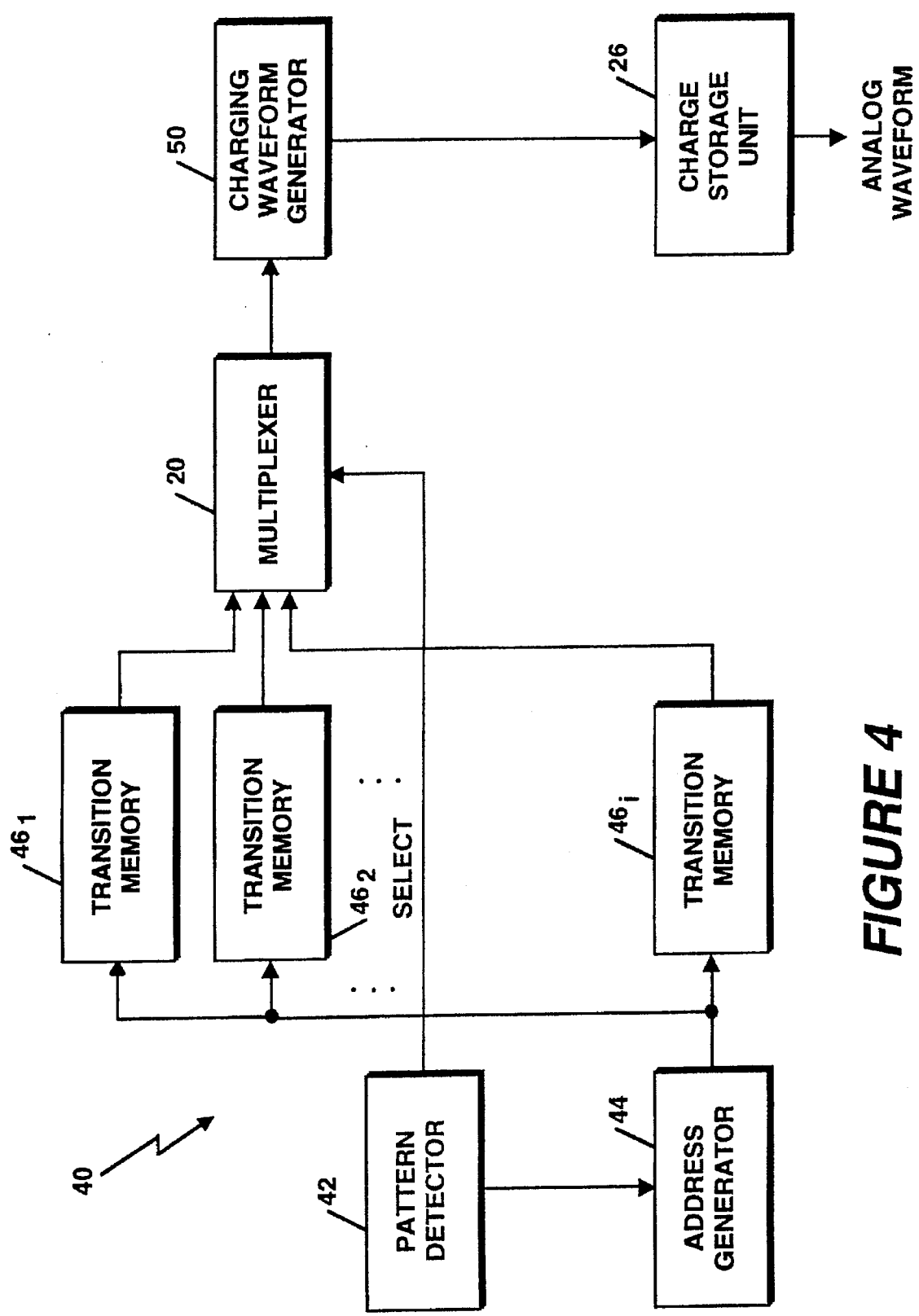
FIG. 4 is a functional block diagram of an alternative embodiment.

In an alternative embodiment, the system responds to patterns in the incoming signal and produces an associated analog signal. As depicted in FIG. 4, a system 40 includes a pattern detector 42 that sends to an address generator 44 a signal that is associated with the pattern in the incoming signal. For example, the pattern detector may determine 2-bit patterns and send to the address generator 44 one of four signals that correspond, respectively, to patterns of 00, 01, 10, and 11. The address generator 44 then sends the appropriate set of addresses to transition memories $46_1$, $46_2$ ... $46_i$ based on the transition between the patterns. Each of the memories contains counts that are associated with a different one of these transitions. In our example, the memory $46_1$ contains counts associated with a transition between the pattern 00 and 01, and so forth.

The counts are supplied, via the multiplexer 20, to the charging waveform generator 50. The generator 50 operates in the same manner as the generator 24 discussed above with reference to FIG. 1. It thus supplies to the charge storage unit 26, for each count, the amount of charge that produces an output voltage, Vo, with the desired instantaneous value to produce the desired shaped pulse.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A system for converting an incoming multiple-level digital signal to analog waveform that includes shaped pulses, the system including:

A. a pattern detector for detecting a pattern in the digital signal;

B. an address generator for generating a sequence of N addresses in response to the detection of a pattern by the pattern detector;

C. a memory means containing code words, the memory means being addressed by the addresses generated by the address generator;

D. a charging waveform generator for generating a charging waveform that is associated with the code words that are retrieved from the addressed locations of the memory; and E. a charge storage unit for producing the analog waveform, the charge storage unit varying the amplitude of the analog waveform in accordance with the charging waveform produced by the charging waveform generator.

2. The system of claim 1, wherein:

i. the charge storage unit includes a first low pass filter; and ii. the charging waveform generator includes a means for producing a sequence of pulses with varying widths in response to the receipt of a code word from the memory, the pulses controlling a charge on a capacitor in the first low pass filter.

3. The system of claim 1, wherein:

i. the charge storage unit includes a first low pass filter; and ii. the charging waveform generator includes a means for producing a signal with varying duty cycle in response to the receipt of a code word from the memory, the signal controlling a charge on a capacitor in the first low pass filter.

4. The system of claim 1, wherein:

i. the charge storage unit includes a first low pass filter; and ii. the charging waveform generator includes a means for producing a signal with varying numbers of maximum-valued pulses in response to the receipt of a code word from the memory, the signal controlling a charge on capacitors in the first low pass filter.

5. The system of claim 2, wherein the charge storage unit includes a second low pass filter, and a charge on a capacitor in the second low pass filter is controlled by the signals produced by the charging waveform generator.

6. The system of claim 3, wherein the charge storage unit includes a second low pass filter, and a charge on a capacitor in the second low pass filter is controlled by the signals produced by the charging waveform generator.

7. The system of claim 4, wherein the charge storage unit includes a second low pass filter, and a charge on a capacitor in the second low pass filter is controlled by the signals produced by the charging waveform generator.

8. The system of claim 5, wherein the charge storage unit includes a buffer amplifier that is connected between the first and second low pass filters.

9. The system of claim 6, wherein the charge storage unit includes a buffer amplifier that is connected between the first and second low pass filters.

10. The system of claim 7, wherein the charge storage unit includes a buffer amplifier that is connected between the first and second low pass filters.

11. The system of claim 1, wherein the shaped pulses have rising edges and falling edges and memory means includes:

a. a rising edge characteristic memory that contains code words associated with the rising edges of the shaped pulses, and b. a falling edge characteristic memory that contains code words associated with the falling edges of the shaped pulses.

12. The system of claim 11, wherein i. the address generator applies the generated addresses simultaneously to the rising edge and falling edge characteristic memories; and ii. the system further includes a multiplexer that under the control of the pattern detector passes to the charging waveform generator the code words retrieved either from the rising edge characteristic memory or from the falling edge characteristic memory.

13. A system for converting an incoming binary bit stream to an analog waveform that includes shaped pulses, the system including:

A. an edge detector for detecting rising and falling transitions in the incoming binary bit stream;

B. an address generator for generating a sequence of N addresses in response to the detection of an edge by the edge detector;

C. a memory means containing code words, the memory means being addressed by the addresses generated by the address generator;

D. a charging waveform generator for generating a charging waveform that is associated with the N code words that are retrieved from the addressed locations of the memory; and E. a charge storage unit for producing the analog waveform, the charge storage unit varying the amplitude of the analog waveform in accordance with the charging waveform produced by the charging waveform generator.

14. The system of claim 13 wherein:

i. the charge storage unit includes a first low pass filter; and ii. the charging waveform generator includes a means for producing a sequence of pulses with varying widths in response to the receipt of a code word from the memory, the pulses controlling a charge on a capacitor in the first low pass filter.

15. The system of claim 13, wherein:

i. the charge storage unit includes a first low pass filter; and ii. the charging waveform generator includes a means for producing a signal with varying duty cycle in response to the receipt of a code word from the memory, the signal controlling a charge on a capacitor in the first low pass filter.

16. The system of claim 13, wherein:

i. the charge storage unit includes a first low pass filter; and ii. the charging waveform generator includes a means for producing a signal with varying numbers of maximum-valued pulses in response to the receipt of a code word from the memory, the signal controlling a charge on capacitors in the first low pass filter.

* * * * *